United States Patent [19]
Kawakita et al.

[11] Patent Number: 5,811,351
[45] Date of Patent: Sep. 22, 1998

[54] SEMICONDUCTOR DEVICE AND METHOD OF MANUFACTURING THE SAME

[75] Inventors: Tetsuo Kawakita, Kyoto; Kazuhiko Matsumura; Ichiro Yamane, both of Osaka, all of Japan

[73] Assignees: Matsushita Electric Industrial Co., Ltd.; Matsushita Electronics Corporation, both of Osaka, Japan

[21] Appl. No.: 978,270

[22] Filed: Nov. 25, 1997

Related U.S. Application Data

[62] Division of Ser. No. 767,778, Dec. 17, 1996, Pat. No. 5,734,199.

[30] Foreign Application Priority Data

Dec. 18, 1995 [JP] Japan ..................................... 7-328519

[51] Int. Cl.⁶ .................................................. H01L 21/44
[52] U.S. Cl. ............................................. 438/613; 438/17
[58] Field of Search ............................... 438/613, 15, 17, 438/18

[56] References Cited

U.S. PATENT DOCUMENTS

| | | |
|---|---|---|
| 4,693,770 | 9/1987 | Hatada . |
| 4,948,754 | 8/1990 | Kondo et al. ........................... 438/613 |
| 5,162,257 | 11/1992 | Yung ....................................... 438/613 |
| 5,214,308 | 5/1993 | Nishiguchi et al. ..................... 438/613 |
| 5,289,631 | 3/1994 | Koopman et al. . |
| 5,523,629 | 6/1996 | Williams et al. . |
| 5,550,408 | 8/1996 | Kunifomo et al. . |
| 5,591,941 | 1/1997 | Acocella et al. . |
| 5,591,959 | 1/1997 | Cigna et al. . |
| 5,598,036 | 1/1997 | Ho . |
| 5,600,180 | 2/1997 | Kusaka et al. . |
| 5,621,225 | 4/1997 | Shieh et al. . |
| 5,625,230 | 4/1997 | Park et al. . |

FOREIGN PATENT DOCUMENTS

| | | |
|---|---|---|
| 57-122542 | 7/1982 | Japan . |
| 4-340758 | 11/1992 | Japan . |

OTHER PUBLICATIONS

IBM Technical Disclosure Bulletin, "Multi Level Alloy Joining System for Semiconductor Dig", vol. 21, No. 2, Dec. 1978 pp. 2743–2746.

*Primary Examiner*—Kevin Picardat
*Attorney, Agent, or Firm*—McDermott, Will & Emery

[57] ABSTRACT

The main surface of a first semiconductor chip having a first functional element is formed with first testing electrodes for testing the electrical characteristics of the first functional element and first connecting electrodes electrically connected to the first functional element. The main surface of a second semiconductor chip having a second functional element is formed with second testing electrodes for testing the electrical characteristics of the second functional element and second connecting electrodes electrically connected to the second functional element. The first semiconductor chip and the second semiconductor chip are integrated by using an insulating resin, with first bumps formed on the first connecting electrodes being bonded to third bumps formed on the second connecting electrodes.

6 Claims, 22 Drawing Sheets

SEMICONDUCTOR DEVICE AND METHOD OF MANUFACTURING THE SAME

This is a divisional of application Ser. No. 08/767,778, filed Dec. 17, 1996 now U.S. Pat. No. 5,734,199.

BACKGROUND OF THE INVENTION

The present invention relates to a semiconductor device comprising a high-performance LSI for implementing an advanced electronic system such as a multimedia or portable system and to a method of manufacturing the same.

In recent years, an electronic system has exhibited an increasing tendency toward higher performance. Along with the tendency, higher performance has also been required of an LSI to be mounted on the electronic system.

However, the integration of all the functions required of the LSI into one chip presents serious problems including a longer development period and higher development cost. To eliminate the problems, there has been proposed the technology of multilayer integration of a plurality of semiconductor chips formed with different types of LSIs.

Referring now to the drawings, a description will be given to a conventional semiconductor device comprising semiconductor chips formed with different types of LSIs that have been stacked in layers.

FIG. 19 shows a cross-sectional structure of the conventional semiconductor device. As shown in the drawing, a first semiconductor chip 11 is electrically connected to a second semiconductor chip 12 through the bonding of a first aluminum electrode 13 formed on the first semiconductor chip 11 to a second aluminum electrode 14 formed on the second semiconductor chip 12 with a bump 15 interposed therebetween. In this case, the bump 15 is metallically bonded to the first and second aluminum electrodes 13 and 14. As examples of the bonded structure implemented between the bump 15 and the first and second aluminum electrodes 13 and 14, the following two are known.

The first bonded structure is implemented by a method as shown in FIG. 20, wherein a barrier metal 23 consisting of layers of Ti-Pd-Au, TiW-Au, or the like is deposited on an aluminum electrode 22 of a semiconductor chip 21 and then Au is precipitated out of the barrier metal 23 by electrolytic plating, resulting in a bump 24 made of Au.

The second bonded structure is implemented by a method as shown in FIG. 21, wherein the bumps 24 are selectively formed on a substrate 25 by electrolytic plating in advance and then pressed against the aluminum electrodes 22 of the semiconductor chip 21 by means of a heated pressing/heating tool 26 to be thermally transferred onto the aluminum electrodes 22.

In either one of the foregoing first and second methods, the step of forming the bump 24 on the aluminum electrode 22 of the semiconductor chip 21 requires numerous, intricate processes. Moreover, the semiconductor chip 21 which has been satisfactory as a product may become faulty during the step of forming the bump 24 on the aluminum electrode 22 of the semiconductor chip 21, which disadvantageously increases the overall manufacturing cost of the semiconductor device.

To overcome the disadvantage, there has recently been proposed a method of forming the bumps 24 by nonelectrolytic plating, which is implemented by a process as shown in FIG. 22. In the process, light-etching using a NaOH solution, phosphoric acid solution, or the like is performed with respect to the aluminum electrode 22 to remove a natural oxidation film formed on the surface of the aluminum electrode 22, followed by a zincate process performed with respect to the surface of the aluminum electrode 22 for forming a Zn layer on the surface of the aluminum electrode 22. Thereafter, the semiconductor chip 21 is immersed in an electroless Ni plating solution to cause a substitution reaction between Zn and Ni, thereby precipitating Ni on the surface of the aluminum electrode 22. After the precipitation of a Ni film having a specified thickness, the semiconductor chip 21 is immersed in an electroless Au plating solution to thinly plate a surface of precipitated Ni with Au. In accordance with the method using electroless plating, the bumps 24 can be formed directly and selectively on the aluminum electrode 22 by simply immersing the semiconductor chip 21 in an electroless plating solution, so that a large cost merit is obtained.

However, the foregoing conventional semiconductor devices have various problems, which will be described below.

First, although a semiconductor chip in its manufacturing process is subjected to a probe test during the interval between the completion of a diffusion process and the initiation of a bump formation process, the area occupied by the aluminum electrodes cannot be reduced to a degree smaller than specified, since it is required to bring a probe terminal of a prober into contact with the aluminum electrode prior to the probe test. As the number of aluminum electrodes that can be provided is from several hundreds to several tens of hundreds, the miniaturization of the semiconductor chip and hence a semiconductor device composed of semiconductor chips stacked in layers is limited undesirably.

Second, a metal prober contacts and scribes the surface of the aluminum electrode during the probe test, causing scratches on the surface of the aluminum electrode. If electroless plating is conducted subsequently with the scratches caused on the surface of the aluminum electrode, Ni is precipitated to reflect the configuration of the surface of the aluminum electrode, so that the final configuration of the bump becomes irregular. As a result, variations occur in the heights of a large number of bumps formed on the semiconductor chip, so that there may be a case where electrical conduction is not achieved between the first aluminum electrodes of the first semiconductor chip and the second aluminum electrodes of the second semiconductor chip when the first and second semiconductor chips are stacked in layers.

Third, when the bumps are formed by precipitating Ni or the like by electroless plating on the aluminum electrodes occupying different areas, the bump formed on the aluminum electrode occupying a larger area becomes higher in level than the bump formed on the aluminum electrode occupying a smaller area. Accordingly, when the first and second semiconductor chips are stacked in layers, electrical conduction is more likely to be achieved between the aluminum electrode occupying a larger area and the aluminum electrode opposed thereto. On the other hand, electrical conduction is less likely to be achieved between the aluminum electrode occupying a smaller area and the aluminum electrode opposed thereto, resulting in the production of faulty items.

SUMMARY OF THE INVENTION

In view of the foregoing, it is an object of the present invention to miniaturize a semiconductor device composed of a first semiconductor chip and a second semiconductor chip stacked in layers and ensure electrical connection between the first and second semiconductor chips.

To attain the above object, each of the first and second semiconductor chips is formed with different types of electrodes in the present invention, which are a connecting electrode for achieving electrical connection and a testing electrode for use in a probe test. The area occupied by the connecting electrode is reduced to a minimum that allows electrical connection, while the area occupied by the testing electrode is reduced to a degree that a probe terminal can contact the testing electrode.

A semiconductor device according to the present invention comprises: a first semiconductor chip having a first functional element; a second semiconductor chip having a second functional element; a first testing electrode formed on a main surface of the first semiconductor chip, for testing an electric characteristic of the first functional element; a first connecting electrode formed on the main surface of the first semiconductor chip, the first connecting electrode occupying an area smaller than the area occupied by the first testing electrode and being electrically connected to the first functional element; a second testing electrode formed on a main surface of the second semiconductor chip, for testing an electric characteristic of the second functional element; a second connecting electrode formed on the main surface of the second semiconductor chip, the second connecting electrode occupying an area smaller than the area occupied by the second testing electrode and being electrically connected to the second functional element; and a bump formed on at least one of the first connecting electrode and the second connecting electrode, wherein the first semiconductor chip and the second semiconductor chip are integrated by using an insulating resin interposed therebetween, with the respective main surfaces thereof being opposed to each other, and the first functional element is electrically connected to the second functional element by the bonding of the first connecting electrode to the second connecting electrode via the bump.

In the semiconductor device according to the present invention, the main surface of the first semiconductor chip is formed with different types of electrodes, which are the first testing electrode for testing the electrical characteristics of the first functional element and the first connecting electrode electrically connected to the first functional element, while the main surface of the second semiconductor chip is formed with different types of electrodes, which are the second testing electrode and the second connecting electrode electrically connected to the first functional element. Accordingly, there is no need to bring probe terminals into contact with the first and second connecting electrodes, so that the first and second connecting electrodes are kept from being scratched during the process of a probe test. As a result, the bump formed on the first or second connecting electrode is prevented from having an irregular configuration or a varied height, which ensures the bonding of the first connecting electrode to the second connecting electrode via the bump.

Since the conventional embodiment comprises only one type of electrodes for both connection and testing, each of the electrodes has occupied an area sufficiently large to allow the probe terminal to touch the electrode. In the semiconductor device according to the present invention, by contrast, the connecting electrodes and the testing electrodes are provided distinctly. Accordingly, the total number of the first and second testing electrodes each occupying an area sufficiently large to achieve contact with the probe terminal can be reduced to a minimum required by the probe test, while the area occupied by each of the first and second connecting electrodes can be reduced to a degree that allows the bonding of the first connecting electrode to the second connecting electrode via the bump since the probe terminal is kept from contact therewith, which reduces the sizes of the first and second semiconductor chips and hence the size of the semiconductor device composed of the first and second semiconductor chips having been integrated.

Consequently, the semiconductor device composed of a multilayer structure of the semiconductor chips formed with different types of LSIs is increased in stability and reliability, while it is miniaturized.

In the semiconductor device according to the present invention, the bump preferably has a clearance adjusting bump formed integrally with a tip portion of the bump to eliminate variations in the clearance between a tip surface of the bump and the first or second connecting electrode opposed to the bump or in the clearance between the adjacent bumps.

The arrangement ensures bonding of the first connecting electrode to the second connecting electrode even when the height of the bump varies due to variations in the size of the first or second connecting electrode. Moreover, since it is unnecessary to press the semiconductor chip against the second semiconductor chip under a large pressing force to ensure the connection between the first and second connecting electrodes, the characteristics of the first functional element formed on the first semiconductor chip or the second functional element formed on the second semiconductor chip will not be impaired, resulting in lower production yield of the semiconductor device.

In this case, the clearance adjusting bump is preferably made of a soft metal. The arrangement facilitates the deformation of the clearance adjusting bump in the step of transferring the clearance adjusting bump onto the tip portion of the bump or in the step of pressing the first semiconductor chip against the second semiconductor chip. Accordingly, the clearance adjusting bump can surely eliminate variations in the clearance between the tip surface of the bump and the first or second connecting electrode opposed to the bump or in the clearance between the adjacent bumps.

In the semiconductor device according to the present invention, the second semiconductor chip is preferably larger than the first semiconductor chip and the second testing electrode is preferably formed on a peripheral region of the second semiconductor chip not facing the first semiconductor chip.

In the arrangement, the probe test can easily be performed with respect to the semiconductor device composed of the first and second semiconductor chips having been integrated by bringing the probe terminal into contact with the second testing electrode.

In the semiconductor device according to the present invention, the bump is preferably formed by electroless plating. The arrangement enables selective formation of the first or second connecting electrode simply by immersing the first or second connecting electrode in the electroless plating solution, resulting in lower manufacturing cost of the semiconductor device.

A method of manufacturing a semiconductor device according to the present invention comprises: an electrode forming step of forming, on a main surface of a first semiconductor chip having a first functional element, a first testing electrode for testing an electric characteristic of the first functional element and a first connecting electrode occupying an area smaller than the area occupied by the first testing electrode and electrically connected to the first functional element, while forming, on a main surface of a second semiconductor chip having a second functional element, a second testing electrode for testing an electric characteristic of the second functional element and a second connecting electrode occupying an area smaller than the area occupied by the second testing electrode and electrically connected to the second functional element; a bump forming step of forming a bump on at least one of the first connecting electrode and the second connecting electrode; a bonding step of bonding the first connecting electrode to the second connecting electrode via the bump; and an integrating step of integrating the first semiconductor chip and the second semiconductor chip by using an insulating resin interposed therebetween, with the respective main surfaces thereof being opposed to each other.

In accordance with the method of manufacturing a semiconductor device of the present invention, the first and second testing electrodes are used for the probe test, while the first and second connecting electrodes need not be brought into contact with the probe terminals, so that the bump formed on the first or second connecting electrode is prevented from having an irregular configuration or a varied height.

In the method of manufacturing a semiconductor device, the bump forming step preferably includes a step of forming, integrally with a tip portion of the bump, a clearance adjustment for eliminating variations in the clearance between a tip surface of the bump and the first or second connecting electrode opposed to the bump or in the clearance between the adjacent bumps.

The arrangement ensures connection between the first and second connecting electrodes even when the height of the bump varies due to variations in the size of the first or second connecting electrode.

In this case, the bump forming step preferably includes a step of forming the clearance adjusting bump made of a soft metal on the tip portion of the bump. The arrangement facilitates the deformation of the clearance adjusting bump. Accordingly, the clearance adjusting bump can surely eliminate variations in the clearance between the tip surface of the bump and the first or second connecting electrode opposed to the bump or in the clearance between the adjacent bumps.

In the case mentioned above, the bump forming step preferably includes a step of forming the clearance adjusting bump on the tip portion of the bump by preliminarily forming the clearance adjusting bump on a plane surface of a substrate and then pressing the bump against the clearance adjusting bump such that the clearance adjusting bump is transferred onto the bump.

The arrangement equalizes the height of the tip surface of the clearance adjusting bump from the main surface of the first or second semiconductor chip in the transfer step, so that the clearance adjusting bump surely eliminates variations in the clearance between the tip surface of the bump and the first or second connecting electrode opposed to the bump or in the clearance between the adjacent bumps.

In the method of manufacturing a semiconductor device according to the present invention, the electrode forming step preferably includes a step of forming the second testing electrode on, of the second semiconductor chip larger than the first semiconductor chip, a peripheral region not facing the first semiconductor chip.

The arrangement facilitates a probe test conducted with respect to the semiconductor device composed of the first and second semiconductor chips having been integrated by bringing the probe terminal into contact with the second testing electrode in the semiconductor device.

In the method of manufacturing a semiconductor device according to the present invention, the bump forming step preferably includes a step of forming the bump by electroless plating. The arrangement enables selective formation of the bump on the first or second connecting electrode simply by immersing the first or second connecting electrode in an electroless plating solution, resulting in lower manufacturing cost of the semiconductor device.

DETAILED DESCRIPTION OF THE INVENTION (First Embodiment)

Below, a semiconductor device according to a first embodiment of the present invention will be described with reference to FIG. 1.

Figure 1:
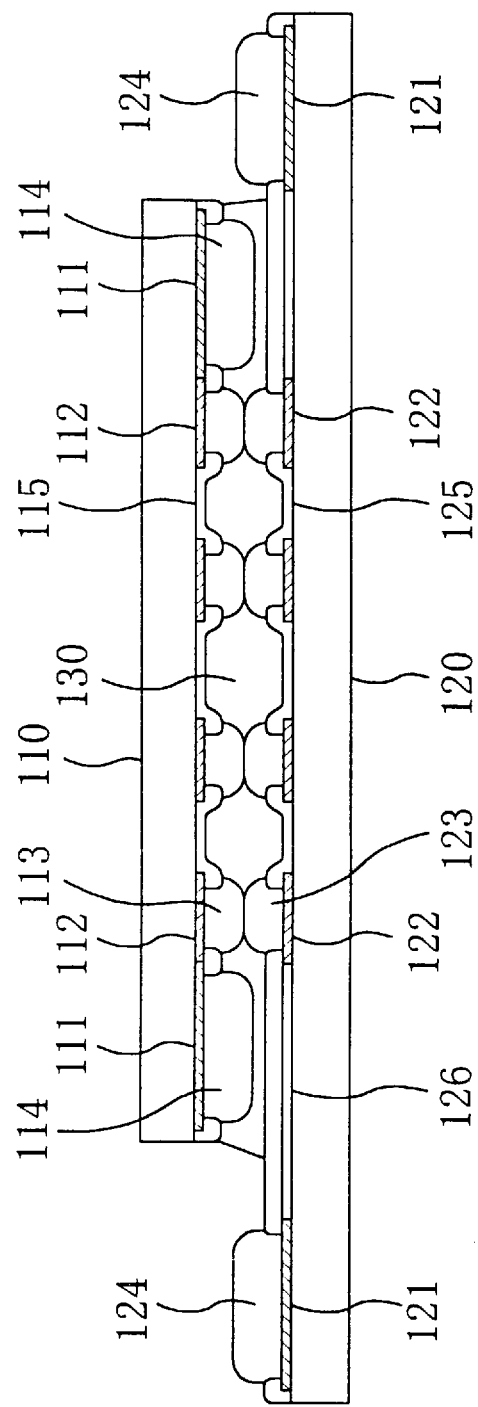
FIG. 1 is a cross-sectional view of a semiconductor device according to a first embodiment of the present invention.

FIG. 1 shows a cross-sectional structure of the semiconductor device according to a first embodiment, in which first and second semiconductor chips 110 and 120 are internally formed with first and second functional elements, respectively, though the drawing thereof is omitted.

As shown in FIG. 1, the main surface of the first semiconductor chip 110 is formed with first testing electrodes 111 made of aluminum for testing the electrical characteristics of the first functional element and first connecting electrodes 112 made of aluminum, each of which occupies an area smaller than the area occupied by the first testing electrode 111 and is electrically connected to the first functional element. On the other hand, the main surface of the second semiconductor chip 120 is formed with second testing electrodes 121 made of aluminum for testing the electrical characteristics of the second functional element and second connecting electrodes 122 made of aluminum, each of which occupies an area smaller than the area occupied by the second testing electrode 121 and is electrically connected to the second functional element. In this case, the first and second connecting electrodes 112 and 122 are formed in positions opposed to each other.

First and second bumps 113 and 114 are formed on the first connecting electrodes 112 and on the first testing electrodes 111, respectively. A first protective film 115 is formed on the regions of the main surface of the first semiconductor chip 110 other than the regions formed with the first and second bumps 113 and 114. Third and fourth bumps 123 and 124 are formed on the second connecting electrodes 122 and on the second testing electrodes 121, respectively. A second protective film 125 is formed on the regions of the main surface of the second semiconductor chip 120 other than the regions formed with the third and fourth bumps 123 and 124. In this case, each of the first, second, third, and fourth bumps 113, 114, 123, and 124 has a three-layer structure consisting of Zn, Ni, and Au layers formed by electroless plating.

The first connecting electrode 112 is connected to the first testing electrode 111 by a first metal wire (not shown), while the second connecting electrode 122 is connected to the second testing electrode 121 by a second metal wire 126. In the arrangement, the first testing electrodes 111 are electrically connected to the first functional element via the first connecting electrodes 112, while the second testing electrodes 121 are electrically connected to the second functional element via the second connecting electrodes 122. Alternatively, the first testing electrodes 111 may be connected directly to the first functional element without intervention of the first connecting electrodes 112 and the second testing electrodes 121 may be connected directly to the second functional element without intervention of the second connecting electrodes 122.

The bonding of the first bumps 113 to the third bumps 123 provides electrical connection between the first and second connecting electrodes 112 and 122. The first and second semiconductor chips 110 and 120 are integrated by using an insulating resin 130 interposed therebetween with the respective main surfaces of the first and second semiconductor chips 110 and 120 being opposed to each other.

In the semiconductor device according to the first embodiment, the first semiconductor chip 110 is provided with the first connecting electrodes 112 and the first testing electrodes 111, while the second semiconductor chip 120 is provided with the second connecting electrodes 122 and the second testing electrodes 121, so that a probe test is conducted with probe terminals kept in contact with the first and second testing electrodes 111 and 121 and kept from contact with the first and second connecting electrodes 112 and 122. As a result, the first and second connecting electrodes 112 and 122 are prevented from being scratched during the process of the probe test, so that the first and third bumps 113 and 123 having excellent configurations and equal heights are formed on the first and third connecting electrodes 112 and 122, which ensures the bonding of the first bumps 113 to the third bumps 123.

Moreover, the total number of the first and second testing electrodes 111 and 121 each of which should have a sufficient size to allow the probe terminal to be connected thereto can be reduced to a minimum required by the probe test. Furthermore, the area occupied by each of the first and second connecting electrodes 112 and 122 can be reduced to a degree that allows connection therebetween via the first and third bumps 113 and 123, while the limitation on where the first and second connecting electrodes should be placed is eliminated because of the small area occupied by each of the first and second connecting electrodes 112 and 122. Accordingly, the first and second connecting electrodes 112 and 122 can be provided on small regions of the main surfaces of the first and second semiconductor chips 110 and 120. Therefore, the first and second semiconductor chips 110 and 120 can be miniaturized.

On the other hand, the formation of the first, second, third, and fourth bumps 113, 114, 123, and 124 by electroless plating enables the first, second, third, and fourth bumps 113, 114, 123, and 124 to be selectively formed by simply immersing the first and second testing electrodes 111 and 121 and the first and second connecting electrodes 112 and 122 in an electroless plating solution, resulting in reduced manufacturing cost.

In addition, since the second semiconductor chip 120 is larger than the first semiconductor chip 110 and the second testing electrodes 121 are formed on the peripheral region of the second semiconductor chip 120 not facing the first semiconductor chip 110, the probe test can be conducted with respect to the semiconductor device composed of the first and second semiconductor chips 110 and 120 having been integrated by bringing the probe terminals into contact with the second testing electrodes 121.

Below, a method of manufacturing a semiconductor device according to the first embodiment will be described with reference to FIGS. 2 to 10.

Figure 2:
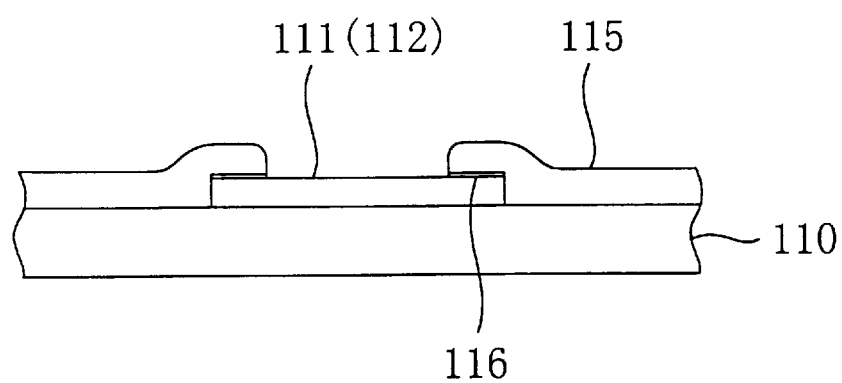
FIG. 2 is a cross-sectional view illustrating a light-etching step in a method of manufacturing a semiconductor device according to the first embodiment.

First, the first testing electrodes 111 and the first connecting electrodes 112 are formed on the main surface of the first semiconductor chip 110 formed with the first functional element, followed by the deposition of the first protective film 115 on the regions of the main surface of the first semiconductor chip 111 other than the regions formed with the first and second bumps 113 and 114, as shown in FIG. 2. Thereafter, degreasing and light-etching processes are performed with respect to the first testing electrodes 111 and the first connecting electrodes 112, thereby removing the portions of a natural oxidation film 116 formed on the surfaces of the first testing electrodes 111 and the first connecting electrodes 112 which are uncovered with the first protective film 115.

Figure 3:
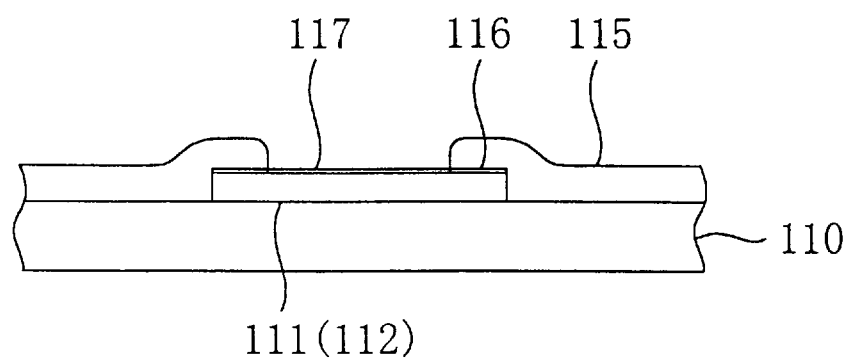
FIG. 3 is a cross-sectional view showing a process step prior to electroless Ni plating in the method of manufacturing a semiconductor device according to the first embodiment.

Then, a Zn substitution process is performed with respect to the surfaces of the first testing electrodes 111 and the first connecting electrodes 112 prior to electroless Ni plating to prevent reoxidation of the first testing electrodes 111 and the first connecting electrodes 112, thereby forming a Zn layer 117 on the surfaces of the first testing electrodes 111 and the first connecting electrodes 112, as shown in FIG. 3. In the step preceding electroless Ni plating, a Pd layer or Ni layer may be formed instead of the Zn layer 117.

Figure 4:
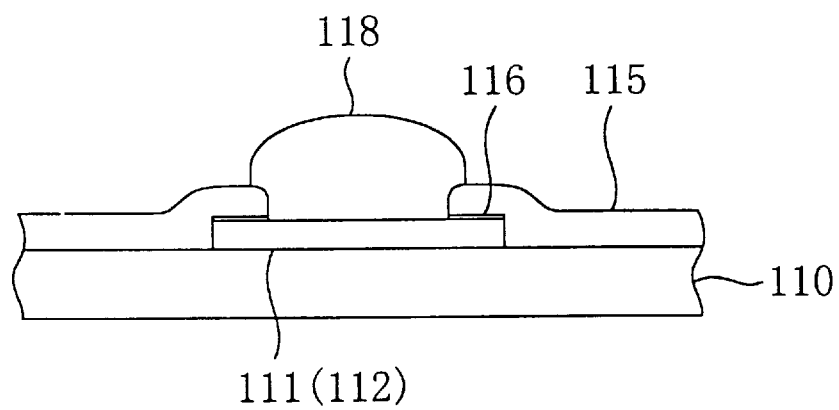
FIG. 4 is a cross-sectional view showing the process step of electroless Ni plating in the method of manufacturing a semiconductor device according to the first embodiment.

Next, the first testing electrodes 111 and the first connecting electrodes 112 are immersed in an electroless Ni plating solution to form a Ni thick layer 118 to serve as the cores of the first and second bumps 113 and 114, as shown in FIG. 4.

Figure 5:
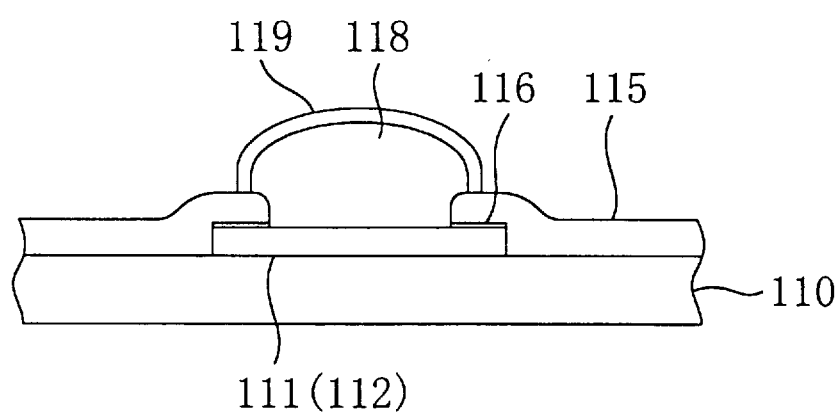
FIG. 5 is a cross-sectional view showing the process step of electroless Au plating in the method of manufacturing a semiconductor device according to the first embodiment.

Subsequently, the first testing electrodes 111 and the first connecting electrodes 112 are immersed in an electroless Au plating solution to form a Au layer 119 on the surface of the Ni thick layer 118, as shown in FIG. 5, thus forming the first and second bumps 113 and 114 composed of the three-layer structure consisting of the Zn, Ni, and Au layers.

It is to be noted that, after the formation of the second testing electrodes 121 and the second connecting electrodes 122 on the main surface of the second semiconductor chip 120 formed with the second functional element, the first protective film 125 is deposited on the regions of the main surface of the second semiconductor chip 120 other than the regions formed with the third and fourth bumps 124 and then the third and fourth bumps 123 and 124 consisting of the Zn, Ni, and Au layers are formed on the surfaces of the second testing electrodes 121 and the second connecting electrodes 122, though the drawing thereof is omitted.

Below, a description will be given to the respective sizes of the first and second testing electrodes 111 and 121, first and second connecting electrodes 112 and 122, and first to fourth bumps 113, 114, 123, and 124 and to specific manufacturing methods thereof.

In the first embodiment, each of the first and second testing electrodes 111 and 121 has a size of 92×92 μm and a pitch of 150 μm. Each of the first and second connecting electrodes 112 and 122 has a size of 15 μmφ and a pitch of 30 μm. Each of the first and second testing electrodes 111 and 121 and of the first and second connecting electrodes 112 and 122 is formed by sputtering, has a thickness of about 1 μm, and is made of Al-1%Si-0.5%Cu.

Each of the first and second protective films 115 and 125 is composed of a $Si_3N_4$ film having a thickness of 1 μm.

In the light-etching process performed with respect to the first and second testing electrodes 111 and 121 and the first and second connecting electrodes 112 and 122, the first and second testing electrodes 111 and 121 and the first and second connecting electrodes 112 and 122 are immersed in a phosphoric acid solution or a NaOH solution to remove the outermost portions of the respective surfaces of the electrodes corresponding to a thickness of about 0.1 μm.

In the Zn substitution process performed with respect to the first and second testing electrodes 111 and 121 and the first and second connecting electrodes 112 and 122, a Zn layer 117 having a thickness of about 50nm is formed.

In the process of forming the Ni thick layer 118, an electroless Ni plating solution containing nickel sulfate as a main component is used so that the first testing electrodes 111 and the first connecting electrodes 121 are immersed in the electroless Ni plating solution at 90° C. for 10 minutes, thereby precipitating the Ni thick layer 118 having a thickness of about 4 μm.

In the process of forming the Au layer 119, a cyan-based electroless Au plating solution is used so that the first testing electrodes 111 and the first connecting electrodes 112 are immersed in the electroless Au plating solution at 90° C. for 30 minutes, thereby forming the Au layer 119 having a thickness of about 0.1 to 0.3 μm. In the case of forming a thick Au layer in place of the Au layer 119 having a normal film thickness, Au plating for thickening is performed with respect to the surface of the Au layer 119. In this case, the Au layer having a thickness of about 2 μm is formed by immersing the first testing electrodes 111 and the first connecting electrodes 112 in the cyan-based plating solution at 73° C. for about 20 minutes.

Below, a description will be given to the process of stacking the first and second semiconductor chips 110 and 120 in layers for integration.

Figure 6:
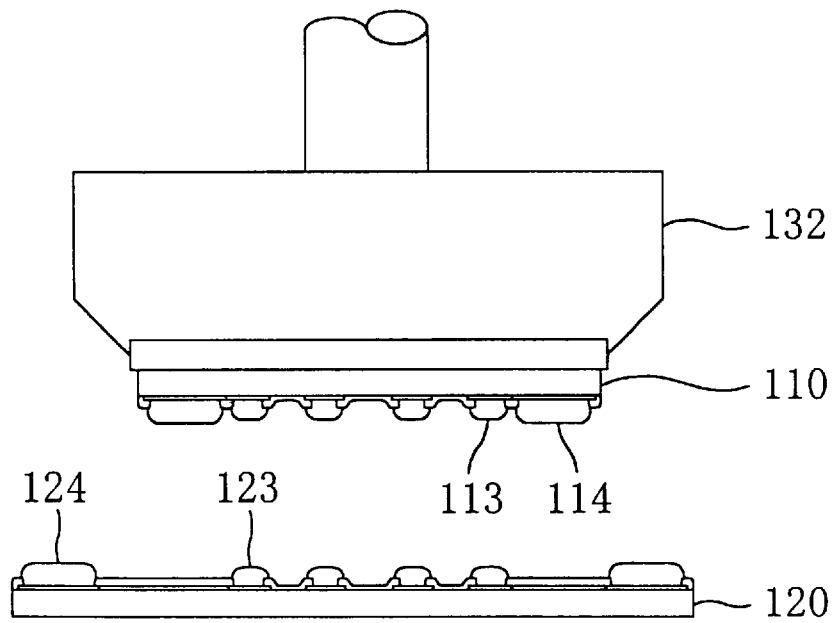
FIG. 6 is a cross-sectional view showing the step of aligning bumps in the method of manufacturing a semiconductor device according to the first embodiment.

First, as shown in FIG. 6, the first bumps 113 of the first semiconductor chip 110 are aligned with the third bumps 123 of the second semiconductor chip 120 with the first semiconductor chip 110 held by a pressing tool 132 from the back surface thereof.

Figure 7:
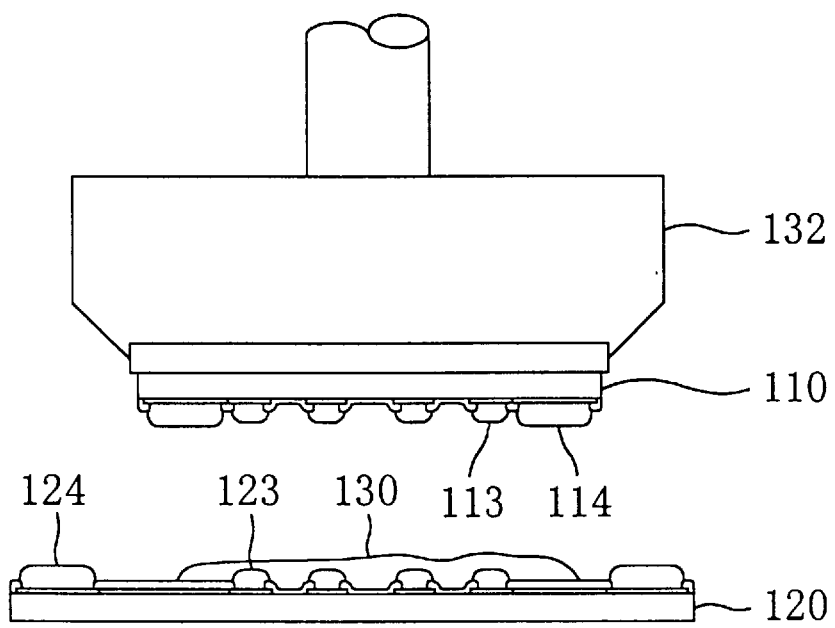
FIG. 7 is a cross-sectional view showing the step of applying an insulating resin.
Figure 8:
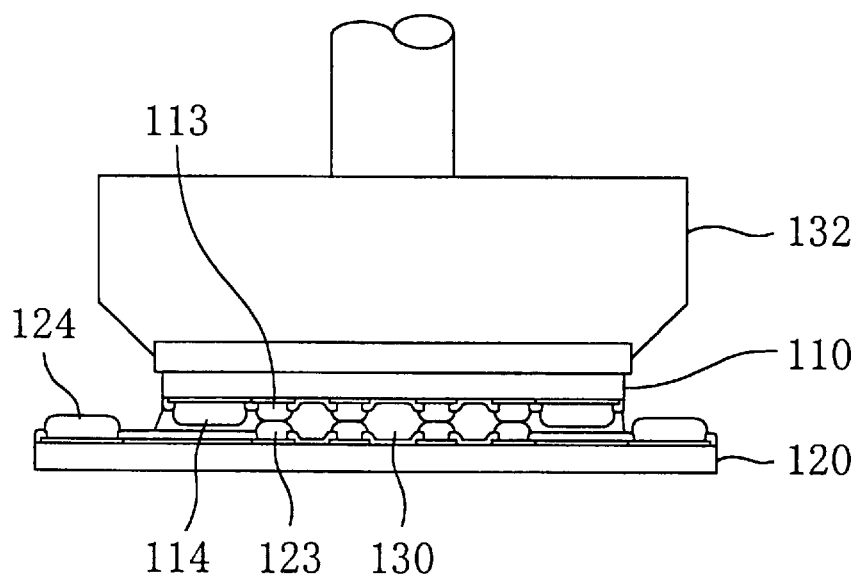
FIG. 8 is a cross-sectional view showing the step of bonding bumps in the method of manufacturing a semiconductor device according to the first embodiment.

Next, as shown in FIG. 7, a light-hardening insulating resin 130 is applied over the entire surfaces of the third bumps 123. Thereafter, the pressing tool 132 is lowered to press the first semiconductor chip 110 against the second semiconductor chip 120, as shown in FIG. 8, thereby bonding the first bumps 113 to the third bumps 123. In the process, when the first semiconductor chip 110 is pressed against the second semiconductor chip 120, the insulating resin 130 is pushed out of the space between the first and third bumps 113 and 123 to the periphery so that substantially no insulating resin 130 exists between the first and third bumps 113 and 123.

Figure 9:
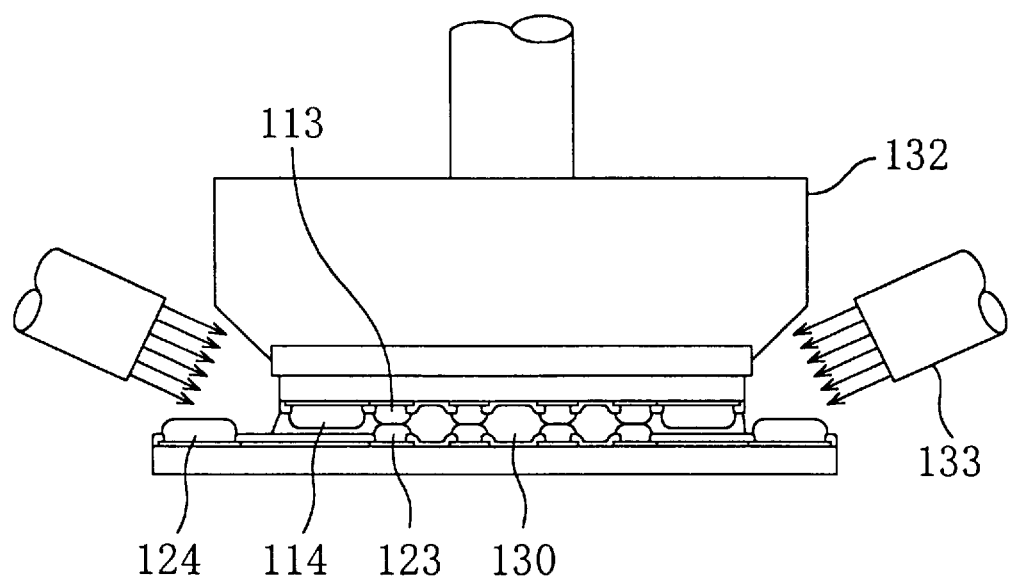
FIG. 9 is a cross-sectional view showing the step of hardening the insulating resin in the method of manufacturing a semiconductor device according to the first embodiment.

Next, as shown in FIG. 9, the insulating resin 130 lying between the first and second semiconductor chips 110 and 120 is illuminated with an ultraviolet ray from an ultraviolet-ray illuminating apparatus 133 to be hardened, thereby integrating the first and second semiconductor chips 110 and 120.

Figure 10:
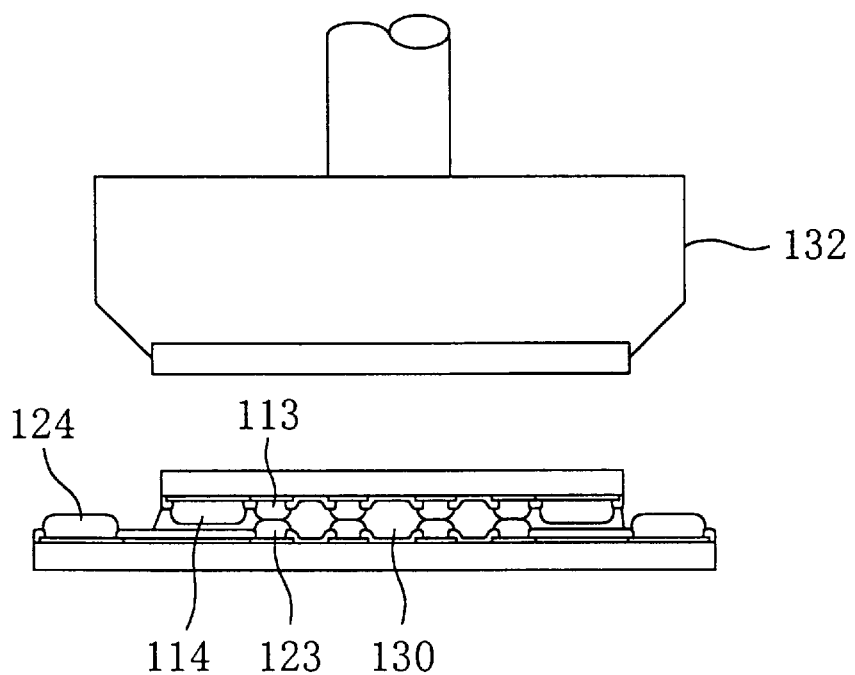
FIG. 10 is a cross-sectional view showing the step of removing a pressing force in the method of manufacturing a semiconductor device according to the first embodiment.

Next, as shown in FIG. 10, the pressing tool 132 is raised to remove the pressing force applied to the back surface of the first semiconductor chip 110, resulting in the semiconductor device according to the first embodiment.

(Second Embodiment)

Figure 11:
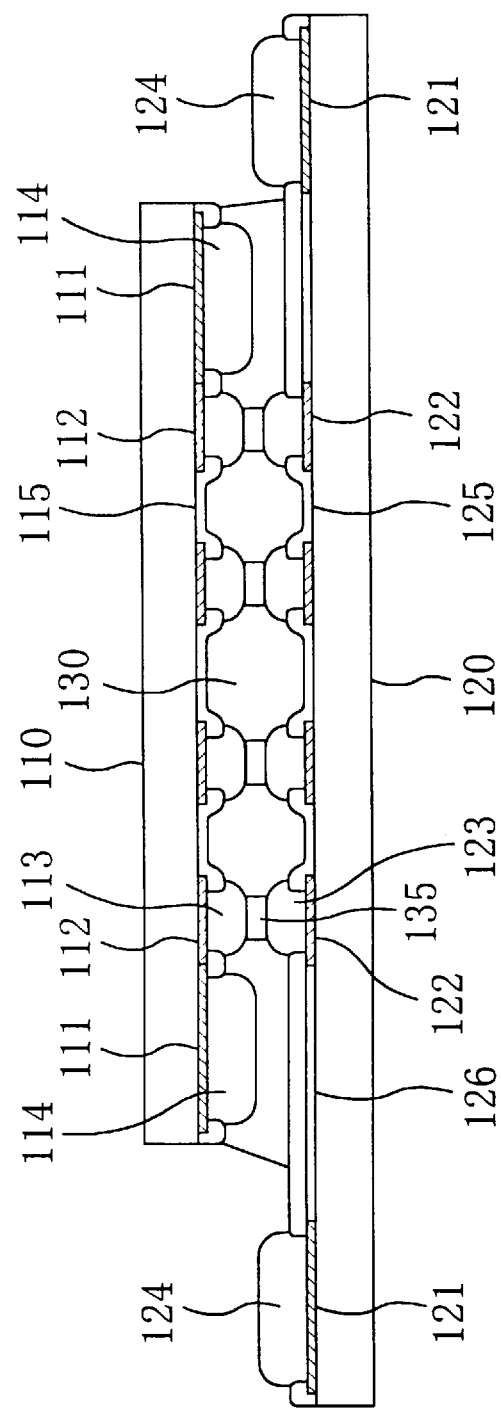
FIG. 11 is a cross-sectional view of a semiconductor device according to a second embodiment of the present invention.

Below, a semiconductor device according to a second embodiment of the present invention will be described with reference to FIG. 11.

In the second embodiment, the description of like components used in the first embodiment is omitted by providing like reference numerals.

The second embodiment is characterized in that clearance adjusting bumps 135 made of a soft metal for eliminating variations in the clearance between the first and third bumps 113 and 123 are integrally provided on the tip portions of the first bumps 113 or third bumps 123. The arrangement ensures the bonding of the first bumps 113 to the third bumps 123 irrespective of varied clearances between the first bumps 113 and the third bumps 123 resulting from different areas occupied by the first and second connecting electrodes 112 and 122, thereby ensuring the bonding of the first connecting electrodes 112 to the second connecting electrodes 122.

A description will be given below to a method of manufacturing the semiconductor device according to the second embodiment with reference to FIGS. 12 to 18.

Initially, the first testing electrodes 111 and the first connecting electrodes 112 are formed on the main surface of the first semiconductor chip 110 formed with the first functional element, followed by the deposition of the first protective film 115 on the regions of the main surface of the first semiconductor chip 110 other than the regions formed with the first bumps 113 and second bumps 114 (see FIG. 11), similarly to the method of manufacturing the semiconductor device according to the first embodiment. Thereafter, these portions of the natural oxidation film formed on the surfaces of the first testing electrodes 111 and the first connecting electrodes 112 which are uncovered with the first protective film 115 are removed, followed by the formation of the second bumps 114 and the first bumps 113 on the first testing electrodes 111 and on the first connecting electrodes 112, respectively.

Figure 12:
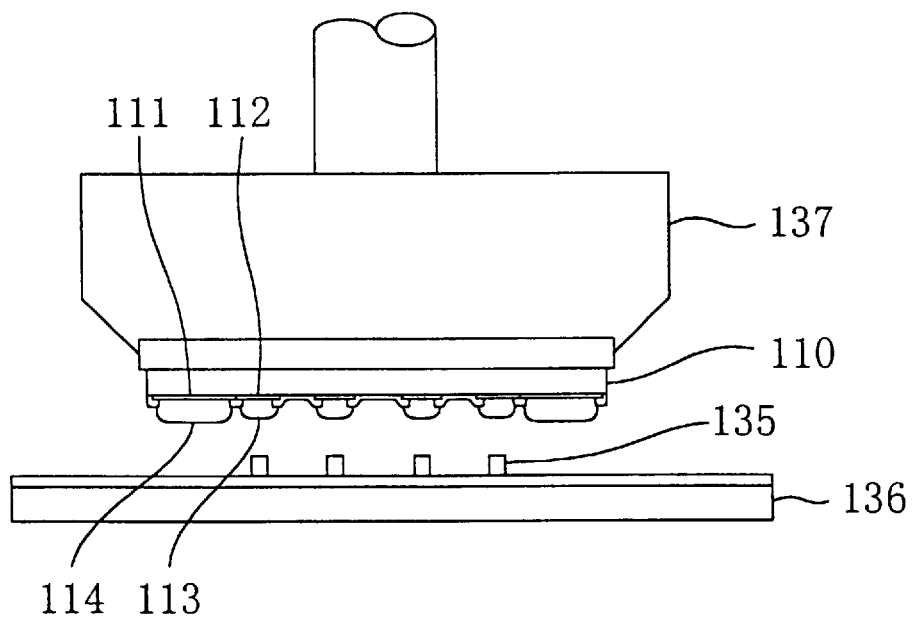
FIG. 12 is a cross-sectional view showing the step of aligning first bumps with clearance adjusting bumps in the method of manufacturing a semiconductor device according to the second embodiment.
Figure 13:
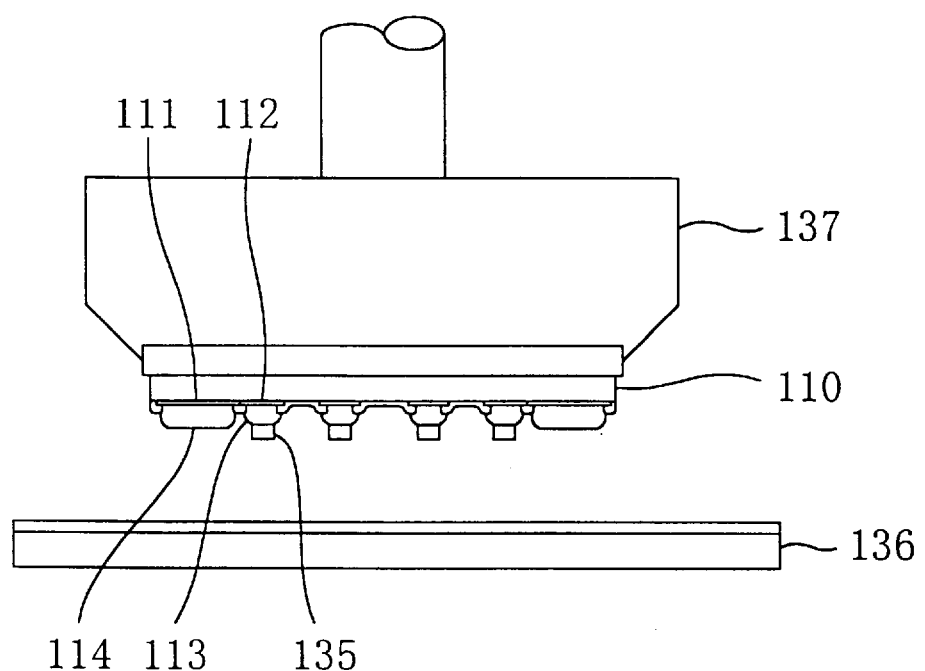
FIG. 13 is a cross-sectional view showing the step of thermally transferring the clearance adjusting bumps in the method of manufacturing a semiconductor device according to the second embodiment.

Then, as shown in FIG. 12, the clearance adjusting bumps 135 made of a soft metal such as indium, an alloy of indium and tin, or the like are formed at positions on the substrate 136 corresponding to the first bumps 113. Each of the clearance adjusting bumps 135 is formed to have a diameter of about 10 to 20 $\mu m\phi$ and a height of about 5 to 10 $\mu m$. Subsequently, the first bumps 113 of the first semiconductor chip 110 are aligned with the clearance adjusting bumps 135 on the substrate 136 with the first semiconductor chip 110 held by a pressing/heating tool 137 from the back surface thereof. Thereafter, the pressing/heating tool 137 is lowered to thermally transfer the clearance adjusting bumps 135 onto the first bumps 113 and then raised, as shown in FIG. 13. In this case, the temperature of the pressing/heating tool 137 is in the range of about 150° to 250° C. and the pressing force exerted thereby is about 1 to 10 g per first connecting electrode 112. The clearance adjusting bumps 135 made of a soft metal are deformed during the thermal transfer involving the application of the pressing force, so that the tip surfaces of the clearance adjusting bumps 135 thermally transferred onto the first bumps 113 become equal in height from the main surface of the first semiconductor chip 110.

Instead of using the thermal transfer method, the tip portions of the first bumps 113 may be dipped into a molten soft metal to form the clearance adjusting bumps 135 integrally with the tip portions of the first bumps 113.

Next, the second testing electrodes 121 and the second connecting electrodes 122 are formed on the main surface of the second semiconductor chip 120 formed with the second functional element, followed by the deposition of the second protective film 125 on the regions of the main surface of the second semiconductor chip 120 other than the regions formed with the third and fourth bumps 123 and 124 (see FIG. 11), similarly to the method of manufacturing the semiconductor device according to the first embodiment. Thereafter, these portions of the natural oxidation film 125 formed on the surfaces of the second testing electrodes 121 and the second connecting electrodes 122 which are uncovered with the second protective film 125 are removed, followed by the formation of the fourth and third bumps 124 and 123 on the second testing electrodes 121 and the second connecting electrodes 122.

Figure 14:
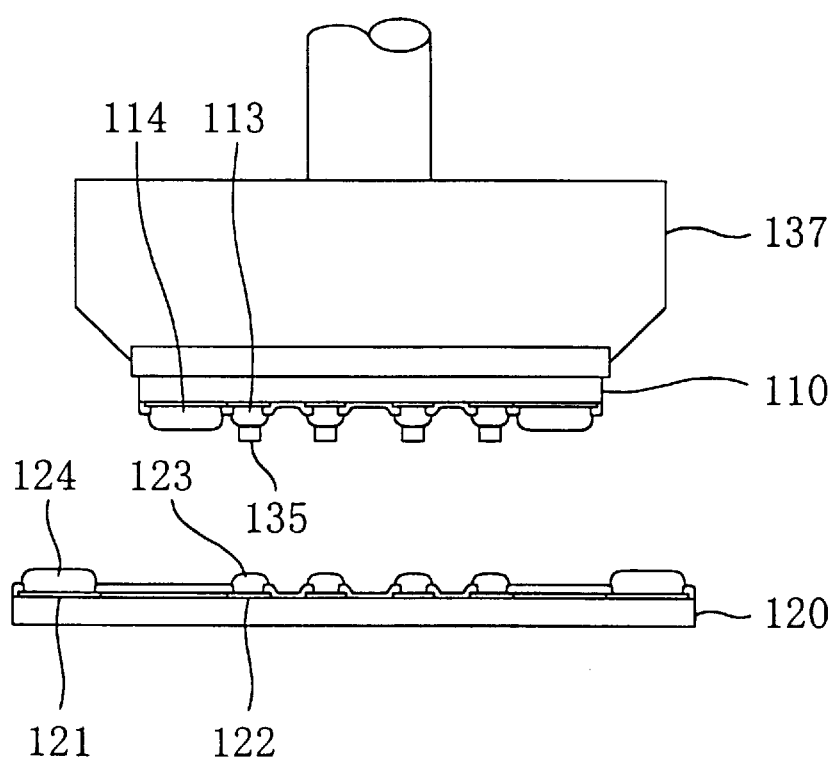
FIG. 14 is a cross-sectional view showing the step of aligning the first bumps with the clearance adjusting bumps in the method of manufacturing a semiconductor device according to the second embodiment.

Then, as shown in FIG. 14, the first bumps 113 of the first semiconductor chip 110 are aligned with the third bumps 123 of the second semiconductor chip 120 with the first semiconductor chip 110 held by the pressing/heating tool 137 from the back surface thereof.

Figure 15:
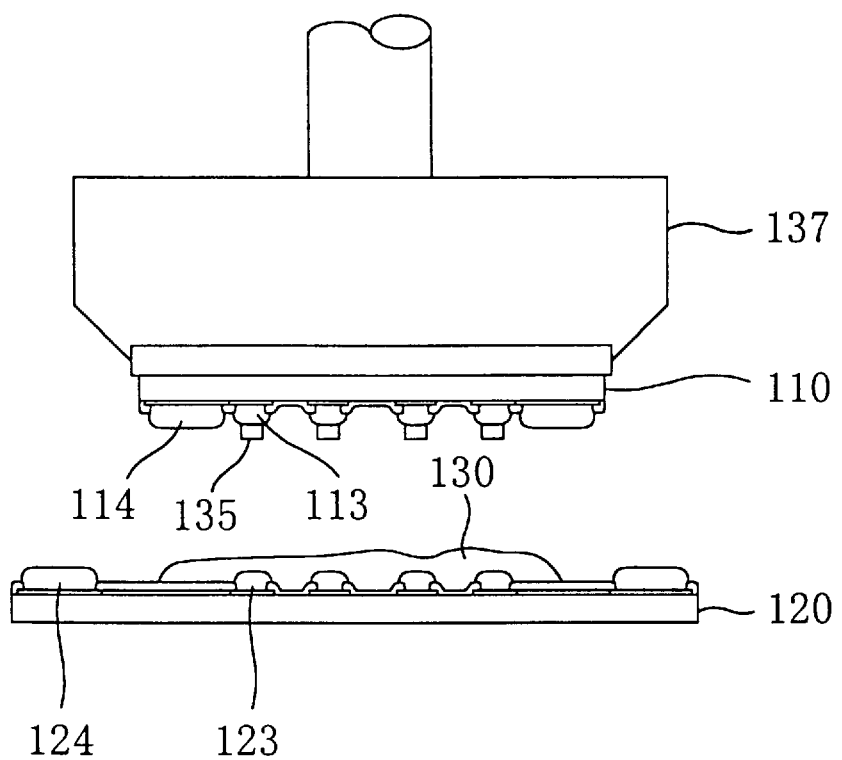
FIG. 15 is a cross-sectional view showing the step of applying an insulating resin in the method of manufacturing a semiconductor device according to the second embodiment.
Figure 16:
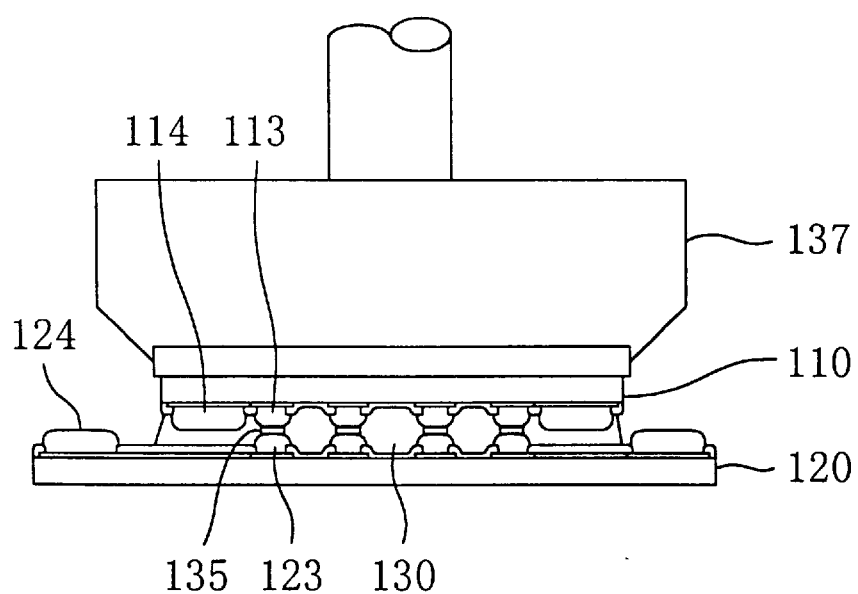
FIG. 16 is a cross-sectional view showing the step of bonding bumps in the method of manufacturing a semiconductor device according to the second embodiment.

Next, as shown in FIG. 15, the light-hardening insulating resin 130 is applied over the entire surfaces of the third bumps 123. Subsequently, the pressing/heating tool 137 is lowered to press the first semiconductor chip 110 against the second semiconductor chip 120, thereby bonding the first bumps 113 to the third bumps 123. Since the insulating resin 130 is pushed out of the space between the first bumps 113 and the third bumps 123, substantially no insulating resin 130 exists therebetween.

Figure 17:
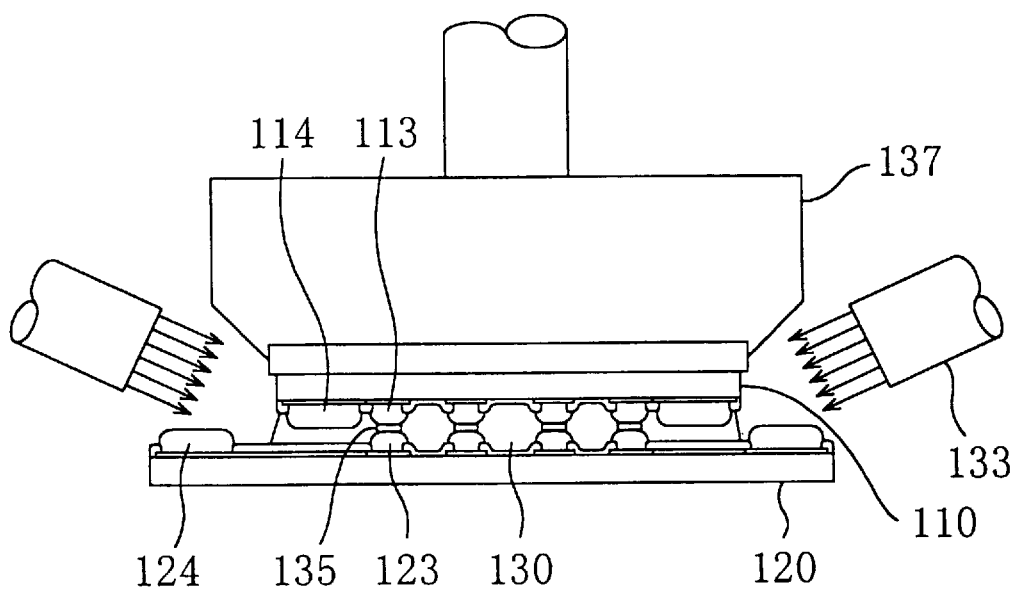
FIG. 17 is a cross-sectional view showing the step of hardening the insulating resin in the method of manufacturing a semiconductor device according to the second embodiment.

Next, as shown in FIG. 17, the insulating resin 130 lying between the first and second semiconductor chips 110 and 120 is illuminated with an ultraviolet ray from the ultraviolet-ray illuminating apparatus 133 to be hardened, thereby integrating the first semiconductor chip 110 and the second semiconductor chip 120.

Figure 18:
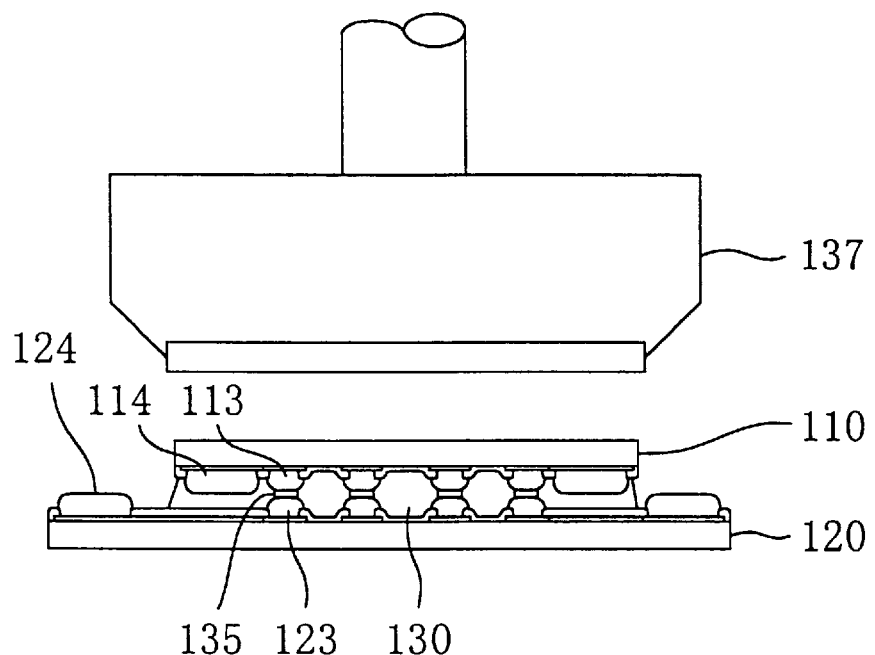
FIG. 18 is a cross-sectional view showing the step of removing a pressing force in the method of manufacturing a semiconductor device according to the second embodiment.
Figure 19:
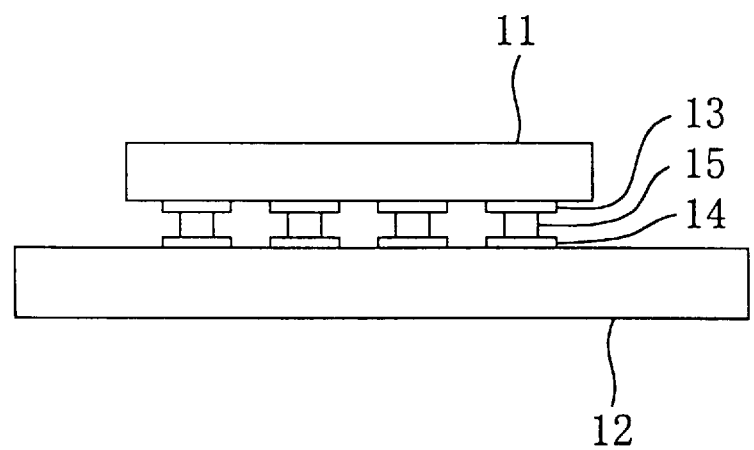
FIG. 19 is a cross-sectional view of a conventional semiconductor device.
Figure 20:
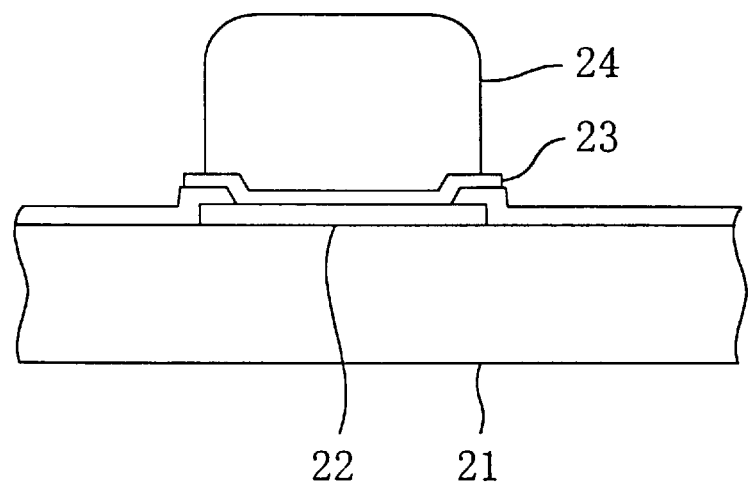
FIG. 20 is a cross-sectional view showing a first bonded structure between an aluminum electrode and a bump in a method of manufacturing the conventional semiconductor device.
Figure 21:
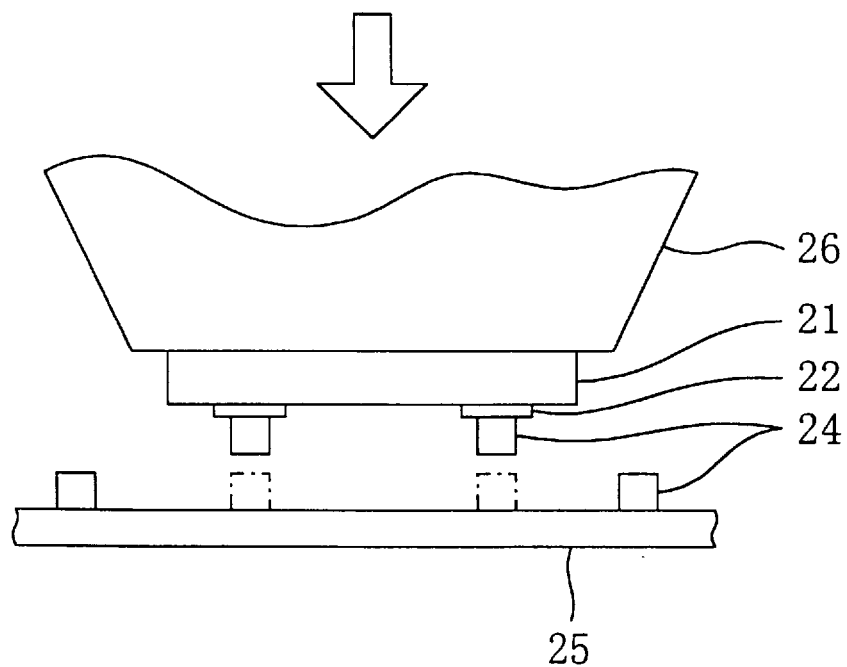
FIG. 21 is a cross-sectional view showing a second bonded structure between the aluminum electrodes and the bumps in the method of manufacturing the conventional semiconductor device.
Figure 22:
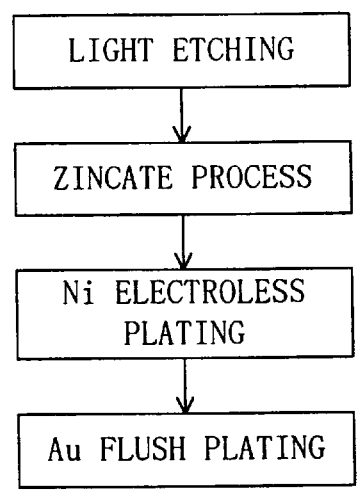
FIG. 22 is a flow chart showing the step of forming the bump by electroless plating in the method of manufacturing the conventional semiconductor device.

Then, as shown in FIG. 18, the pressing/heating tool 137 is raised to remove the pressing force applied to the back surface of the first semiconductor chip 110, resulting in the semiconductor device according to the second embodiment.

Although the second bumps 114 are formed on the first testing electrodes 111 and the fourth bumps 124 are formed on the second testing electrodes 121 in the first and second embodiments, the second and fourth bumps 114 and 124 may not necessarily be formed.

Although the first bumps 113 are formed on the first connecting electrodes 112 and the third bumps 123 are formed on the second connecting electrodes 122, either the first bumps 113 or the third bumps 123 may not necessarily be formed. In this case, the first connecting electrodes 122 are bonded to the second connecting electrodes 122 via the first bumps 113 or the third bumps 123.

We claim:

1. A method of manufacturing a semiconductor device comprising:

an electrode forming step of forming, on a main surface of a first semiconductor chip having a first functional element, a first testing electrode for testing an electric characteristic of said first functional element and a first connecting electrode occupying an area smaller than the area occupied by said first testing electrode and electrically connected to said first functional element, while forming, on a main surface of a second semiconductor chip having a second functional element, a second testing electrode for testing an electric characteristic of said second functional element and a second connecting electrode occupying an area smaller than the area occupied by said second testing electrode and electrically connected to said second functional element;

a bump forming step of forming a bump on at least one of said first connecting electrode and said second connecting electrode;

a bonding step of bonding said first connecting electrode to said second connecting electrode via said bump; and an integrating step of integrating said first semiconductor chip and said second semiconductor chip by using an insulating resin interposed therebetween, with the respective main surfaces thereof being opposed to each other.

2. A method of manufacturing a semiconductor device according to claim 1, wherein said bump forming step includes a step of forming, integrally with a tip portion of said bump, a clearance adjustment for eliminating variations in the clearance between a tip surface of said bump and said first or second connecting electrode opposed to said bump or in the clearance between said adjacent bumps.

3. A method of manufacturing a semiconductor device according to claim 2, wherein said bump forming step includes a step of forming said clearance adjusting bump made of a soft metal on the tip portion of said bump.

4. A method of manufacturing a semiconductor device according to claim 2, wherein said bump forming step includes a step of forming said clearance adjusting bump on the tip portion of said bump by preliminarily forming said clearance adjusting bump on a plane surface of a substrate and then pressing said bump against said clearance adjusting bump such that said clearance adjusting bump is transferred onto said bump.

5. A method of manufacturing a semiconductor device according to claim 1, wherein said electrode forming step includes a step of forming said second testing electrode on, of said second semiconductor chip larger than said first semiconductor chip, a peripheral region not facing said first semiconductor chip.

6. A method of manufacturing a semiconductor device according to claim 1, wherein said bump forming step includes a step of forming said bump by electroless plating.

* * * * *